United States Patent
Pirozzi et al.

(10) Patent No.: US 11,552,621 B2
(45) Date of Patent: Jan. 10, 2023

(54) PROCESSING SYSTEM, RELATED INTEGRATED CIRCUIT AND METHOD

(71) Applicant: STMicroelectronics S.r.l., Agrate Brianza (IT)

(72) Inventors: Francesco Pirozzi, Gravina di Catania (IT); Santi Carlo Adamo, Aci Castello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/539,966

(22) Filed: Dec. 1, 2021

(65) Prior Publication Data

US 2022/0200584 A1 Jun. 23, 2022

(30) Foreign Application Priority Data

Dec. 17, 2020 (IT) .......................... 102020000031235

(51) Int. Cl.
*H03K 3/037* (2006.01)
*G05F 1/46* (2006.01)
*G06F 1/10* (2006.01)

(52) U.S. Cl.
CPC ............... *H03K 3/037* (2013.01); *G05F 1/46* (2013.01)

(58) Field of Classification Search
CPC ........ G06F 1/26; G06F 1/3203; G06F 1/3296; G06K 15/4055; H04W 52/00; Y02D 10/00
USPC .................................................. 713/300–320
See application file for complete search history.

(56) References Cited

U.S. PATENT DOCUMENTS

| | | | |
|---|---|---|---|
| 6,889,317 B2 | 5/2005 | Sami et al. | |
| 6,977,833 B2 | 12/2005 | Day et al. | |
| 7,167,017 B2 | 1/2007 | Arora et al. | |
| 2009/0089599 A1 | 4/2009 | Westwick et al. | |
| 2014/0075066 A1 | 3/2014 | Menard et al. | |
| 2015/0370313 A1* | 12/2015 | Tamura | ............... H01L 29/7869 713/323 |
| 2018/0052791 A1* | 2/2018 | Srivastava | ............ G06F 1/3296 |
| 2018/0159513 A1 | 6/2018 | Reddy et al. | |
| 2020/0344094 A1* | 10/2020 | Mishra | .................... H04L 12/40 |
| 2021/0325951 A1* | 10/2021 | Devarajan | ................. G06F 1/26 |

* cited by examiner

*Primary Examiner* — Quan Tra
(74) *Attorney, Agent, or Firm* — Slater Matsil, LLP

(57) ABSTRACT

A processing system comprising a first sub-circuit configured to be powered by a first supply voltage and a second sub-circuit configured to be powered by a second supply voltage. The first sub-circuit comprises a general-purpose input/out register. The second sub-circuit comprises: a storage circuit configured to selectively store configuration data from the general-purpose input/out register; an input/output interface, at least one peripheral and a selection circuits to exchange signals of the peripherals, and the stored configuration data with the input/output interface. A power management circuit is configured to manage a normal operating mode, and a low-power mode during which the configuration data are maintained stored and the first sub-circuit is switched off. The power management circuit activates the low-power mode in response to receiving a command, and resumes the normal operating mode in response to a wake-up event.

23 Claims, 5 Drawing Sheets

PROCESSING SYSTEM, RELATED INTEGRATED CIRCUIT AND METHOD

CROSS-REFERENCE TO RELATED APPLICATIONS

This application claims the priority benefit of Italian patent application no. 102020000031235, filed on Dec. 17, 2020, which application is hereby incorporated herein by reference.

TECHNICAL FIELD

The present disclosure relates generally to an electronic system and method, and, in particular embodiments, to a processing system, related integrated circuit and method.

BACKGROUND

Digital processing systems comprising at least one digital processing unit, such as a system-on-chip (SoC), are well-known in the art.

FIG. 1 shows a block diagram of an exemplary digital processing system 10, such as a SoC, i.e., the processing system of FIG. 1 may be integrated in an integrated circuit, such as a microcontroller or Digital Signal Processor (DSP). In the example considered, the processing system 10 comprises at least one programmable digital processing unit 102, such as a microprocessor, usually the Central Processing Unit (CPU), programmed via software instructions.

A significant number of microprocessor/CPU architectures are known. For example, as disclosed in U.S. Pat. No. 6,889,317 B2 and which is incorporated herein by reference for this purpose, a microprocessor/CPU 102 often comprises:

one or more Arithmetic Logic Units (ALU) configured to implement a plurality of arithmetic logic operations;
a plurality of registers;
a routing circuit, e.g. in the form of multiplexers and demultiplexers, configured to connect the ALU to the registers; and
an instruction decoder configured to drive the routing circuit and the one or more ALUs as a function of the current software instruction, e.g., in order to connect at least one register to the input of an ALU and a register to the output of an ALU, select the arithmetic operation to be performed by the one or more ALUs, exchange data with a memory, etc.

Usually, the software executed by the processing unit/CPU 102 is stored in a program memory 104, such as a non-volatile memory, such as a Flash memory or EEPROM. Generally, the memory 104 may be integrated with the processing unit 102 in a single integrated circuit, or the memory 104 may be in the form of a separate integrated circuit and connected to the processing unit 102, e.g. via the traces of a printed circuit board. Thus, in general the memory 104 is configured to store the firmware/software of the processing unit 102.

Typically, the processing unit/CPU 102 has also associated a volatile memory 100, such as a Random-Access Memory (RAM), for storing temporary results of the calculations. Also the memory 100 may be integrated with the processing unit 102 in a single integrated circuit, or the memory 100 may be in the form of a separate integrated circuit and connected to the processing unit 102

In the example considered, the processing unit/CPU 102 may have associated one or more resources 106 selected from the group of:

one or more General-Purpose Inputs/Outputs GPIO;
one or more communication interfaces IF, e.g. for exchanging data via the communication system 20, such as a Universal asynchronous receiver/transmitter (UART), Serial Peripheral Interface Bus (SPI), Inter-Integrated Circuit (I2C), Controller Area Network (CAN) bus, and/or Ethernet interface, and/or a debug interface; and/or
one or more analog-to-digital converters AD and/or digital-to-analog converters DA; and/or
one or more dedicated digital components DC, such as hardware timers and/or counters, or a cryptographic co-processor; and/or
one or more analog components AC, such as comparators, sensors, such as a temperature sensor, etc.; and/or
one or more mixed signal components MSC, such as a PWM (Pulse-Width Modulation) driver.

Accordingly, the digital processing system 10 may support different functionalities. For example, the behavior of the processing unit 102 is determined by the firmware stored in the memory 104a, e.g., the software instructions to be executed by a microprocessor/CPU 102 of a SoC 10, such as a micro-controller or DSP. Thus, by installing a different firmware, the same hardware (SoC) can be used for different applications.

In many applications, the processing system 10 may support a low-power mode in order to reduce the power consumption of the processing system 10. For example, this is particularly important in case of battery powered systems or for implementing a stand-by mode of an electronic system comprising the processing system 10.

For example, FIG. 2 shows a second example of a processing system 10, which for simplicity shows only the relevant parts. Specifically, FIG. 2 shows that a typical processing 10 may also comprise:

an oscillator and reset circuit 114 configured to provide a clock signal CLK and a reset signal RST; and
a power supply circuit 112, such as an electronic converter or linear regulator, configured to generate the supply voltage VDD of the processing system 10 from an input voltage VIN.

Generally, these circuits 114 and/or 112 may be integrated in the integrated circuit/SoC comprising the processing unit 102 or may be (at least in part) external with respect to the integrated circuit/SoC of the processing unit 102. For example, a control circuit of the power supply circuit 112 may be integrated in the integrated circuit/SoC, while larger inductors and/or capacitors of the power supply circuit 112 may be connected externally to the integrated circuit.

For example, typically the oscillator and reset circuit 114 is configured to generate the clock signal CLK of the processing system 10 once the supply voltage VDD is provided, and then generates a reset via the reset signal RST in order to bring the processing system into a reset state. For example, for this purpose, usually the various registers of the processing system 10 are reset, e.g., the registers of the processing unit 102 and the resources 106.

In the example considered, the processing system 10 comprises moreover a power management circuit 116. Specifically, this power management circuit 116 is configured to selectively activate a normal operating mode or a low-power mode. For example, as schematically shown in FIG. 2, the power management circuit 116 may be configured to drive the oscillator and reset circuit 114 in order to reduce the frequency of the clock signal CLK or even switch off the generation of the clock signal CLK, at least of the clock signal provided to the processing unit 102. Accordingly, in the low-power mode, the processing unit 102 may operate with a reduced clock frequency or may be suspended. Conversely, when resuming the normal operation mode, the power management circuit 116 may be configured to drive the oscillator and reset circuit 114 in order to use again a normal (higher) frequency of the clock signal CLK.

Switching-off the clock signal CLK may cause that the processing unit 102 is unable to perform any operation. For this reason, the power management circuit 116 may be configured to resume the normal operation mode (with normal clock frequency) in response to one or more events. For example, typically these events correspond to one or more wake-up signals IRQ provided by one or more of the resources 106, such as a change of a logic level of an input pin or an interrupt generated by another resource P, such as a timer, a comparator, etc. For example, while not shown in FIG. 2, for this purpose one or more of the resources 106, e.g., comprising a sequential logic circuit, may still receive the clock signal CLK or another (typically low-frequency) clock signal, or the wake-up signal IRQ may be generated asynchronously.

Accordingly, usually, the power management circuit 116 may be programmed/configured via the processing unit 102, e.g., by executing one or more software instructions for programing one of more registers of the power management circuit 116. For example, for this purpose, the power management circuit 116 may be connected, similar to the resources 106, to the processing unit 102, e.g. via a bus system 108. For example, often the power management circuit 116 is programmable in order to select the power saving mode and/or select the wake-up sources, which should resume the normal operating mode.

In order to further reduce the power consumption, the power management circuit 116 may also be configured to deactivate the power supply of the processing system 10. However, this may cause the registers of the processing system lose their content.

Accordingly, in order to avoid this loss of information, the processing system 10 may use so called retention flip-flops for the registers, which have to maintain the configuration. Retention flip-flops are well-known in the art, and, e.g., disclosed in United States Patent Application No. US 2018/0159513 A1, the content thereof being incorporated herein by reference for this purpose. For example, typically, retention flip-flops are implemented with a master latch powered via a first supply voltage and a slave latch powered with a second supply voltage, and a control part configured to:

before activating the low-power mode, store the information of the master latch also to the slave latch; and
when exiting the low-power mode, restore the information from the slave latch.

Accordingly, in the low power mode, the supply voltage of the master latch and the control part may be deactivated, while the slave latch still stores the original data.

SUMMARY

The inventors have observed that retention-flip flops have several disadvantages.

On the one hand, retention flip-flops are complex and, due to the two-latch structure, big. Thus, using such retention flip-flops (in the processing unit/CPU 102 and the resources 106) may not be suitable for all applications.

On the other hand, retention flip-flops continue to consume energy also in the low-power mode. Thus, using retention flip-flops for the processing unit/CPU 102 may still result in an excessive power consumption.

Moreover, retention flip flops just permit to recover the information from the slave latch at the end of the low-power mode. Accordingly, the data stored to retention flip-flops cannot be used in the low power mode. For example, this problem may be particularly relevant in the context of CPU and General-Purpose Inputs/Outputs, where each pad of the die of the integrated circuit (comprising the processing system 10) may have associated several configuration bits. However, as mentioned before, such General-Purpose Inputs/Output may be directly the source of the wake-up signal used to resume the normal operating mode, or another resource 106 used to generate the wake-up signal has still to be able to transmit and/or receive data via the pads of the integrated circuit, such as a communication interface. In this respect, modern System-on-Chips may also comprise a significant number of GPIO pads.

Some embodiments relate to the management of general-purpose inputs/outputs within processing systems, such as a System-on-Chip (SoC).

Some embodiments provide solutions for managing general-purpose input/output pads of an integrated circuit, in particular for implementing a low-power operating mode.

Some embodiments provide solutions for managing general-purpose input/output pads of an integrated circuit by using a processing system having the features specifically set forth in the claims that follow. Some embodiments moreover concern a related integrated circuit and method.

The claims are an integral part of the technical teaching of the disclosure provided herein.

Various embodiments relate to a processing system comprising at least one pad, such as an integrated circuit, e.g., a System-on-Chip.

Specifically, in various embodiments, the processing system comprises a first sub-circuit, a second sub-circuit and a power supply circuit. The power supply circuit is configured to receive an input voltage and generate a first supply voltage for the first sub-circuit and a second supply voltage for the second sub-circuit. Moreover, the power supply circuit is configured to selectively switch off the first supply voltage, and thus the first sub-circuit, as a function of a first control signal.

In various embodiments, the first sub-circuit comprises a digital processing unit, such as a microprocessor, preferably a CPU, configured to be programmed via software instructions and a general-purpose input/out register configured to be programmed via software instructions executed by the digital processing unit. Specifically, in various embodiments, the general-purpose input/out register is configured to be interfaced with the at least one pad. For this purpose, the general-purpose input/out register may receive (at least) a first data input signal and provide configuration data comprising a first output enable signal, a first data output signal and a peripheral selection signal, i.e., the general-purpose input/out register is configured to receive the configuration data from the digital processing unit and provide the value of the first data input signal to the digital processing unit.

In various embodiments, the second sub-circuit comprises an input/output interface for the pad. Specifically, in various embodiments, the input/output interface comprises an output driver configured to be enabled via an output enable signal and, when enabled, apply a voltage (typically the second supply voltage or ground) to the pad as a function of the logic level of a binary data output signal. Moreover, the input/output interface comprises an input buffer configured to generate a binary data input signal as a function of the voltage at the pad.

In various embodiments, the configuration data stored to the general-purpose input/out register are not provided directly to the input/output interface. Specifically, in various embodiments, the second sub-circuit comprises a storage circuit comprising a plurality of latches, such as D type latches, for providing stored configuration data comprising a stored first output enable signal, a stored first data output signal and a stored peripheral selection signal. Specifically, the plurality of latches is configured to provide or maintain configuration data applied to respective input terminals of the plurality of latches as a function of a second control signal. Specifically, the latches are configured to:
- when the second control signal has a first logic level (e.g., high), provide at the output terminals of the latches the configuration data applied to the input terminals of the latches, i.e., the latches are essentially transparent, and
- when the second control signal has a second logic level (e.g., low), the latches maintain the values of the configuration data at the output terminals of the latches.

In various embodiments, the storage circuit may also comprise for each of the plurality of latches a respective isolation cell. Specifically, these isolation cells are configured to selectively connect the general-purpose input/out register to the input terminals of the plurality of latches as a function of a third control signal, thereby selectively providing the configuration data to the inputs of the plurality of latches.

In various embodiments, the second sub-circuit may also comprise at least one peripheral, such as a communication interface, such as a CAN or SPI interface, configured to receive a second data input signal and provide a second output enable signal and a second data output signal. In this case, the second sub-circuit may comprise a first selection circuit configured to determine the logic level of the data output signal of the input/output interface as a function of the stored first data output signal, the second data output signal and the stored peripheral selection signal. For example, the first selection circuit may be configured to select the stored first data output signal or the second data output signal as the data output signal as a function of the stored peripheral selection signal.

Similarly, a second selection circuit may be configured to determine the logic level of the output enable signal of the input/output interface as a function of the stored first output enable signal, the second output enabled signal and the stored peripheral selection signal. For example, the second selection circuit may be configured to select the stored first output enable signal or the second output enabled signal as the output enable signal as a function of the stored peripheral selection signal.

Similarly, a third selection circuit may be configured to provide the data input signal of the input/output interface as the first data input signal or the second data input signal as a function of the stored peripheral selection signal.

In various embodiments, the second sub-circuit comprises moreover a power management circuit configured to manage a normal operating mode and a low-power mode. Specifically, in various embodiments, the power management circuit is configured to receive one or more commands from the digital processing unit for activating the low-power mode. Specifically, in response to receiving the one or more commands for activating the low-power mode, the power management circuit may set the second control signal to indicate that the plurality of latches should maintain the configuration data, set the third control signal to disconnect the general-purpose input/out register from the inputs of the plurality of latches, and set the first control signal to switch off the first supply voltage.

Conversely, for resuming the normal operating mode, the power management circuit may monitor one or more wake-up signals in order to determine a wake-up event. For example, for this purpose, the power management circuit may be configured to receive a plurality of wake-up signals, select a sub-set of the wake-up signals as a function of given configuration data, and monitor the selected sub-set of wake-up signals in order to determine the wake-up event. Specifically, in various embodiments, in response to determining the wake-up event, the power management circuit sets the first control signal in order to switch on the first supply voltage, thereby activating the normal operating mode, and set the third control signal to connect the general-purpose input/out register to the inputs of the plurality of latches.

Accordingly, in various embodiments, the power management circuit does not set the second control signal directly in response to the wake-up event. In fact, in various embodiments, the power management circuit is configured to receive a separate command from the digital processing unit for reactivating the plurality of latches. Accordingly, in response to receiving the command for reactivating the plurality of latches, the power management circuit may set the second control signal to indicate that the plurality of latches should provide the configuration data applied to the input terminal of the latches.

For example, in order to manage the above operations, the power management circuit may comprise a further register configured to be programmed via the digital processing unit, wherein the further register comprises first configuration data and second configuration data. Specifically, in various embodiments, the second control signal may be determined as a function of the first configuration data, and the first control signal and the third control signal may be determined as a function of the second configuration data. For example, in this case, the one or more commands for activating the low-power mode may comprise a first command for programming the first configuration data, thereby setting the second control signal to indicate that the plurality of latches should maintain the configuration data. The one or more commands may comprise also a second command for programming the second configuration data, thereby setting the third control signal to disconnect the general-purpose input/out register from the inputs of the plurality of latches and the first control signal to switch off the first supply voltage. Conversely, the command for reactivating the plurality of latches may comprise a third command for programming the first configuration data, thereby setting the second control signal to indicate that the plurality of latches should provide the configuration data applied to the input terminals of the latches.

In fact, as mentioned before, the digital processing unit and the general-purpose input/out register are in the first sub-circuit and thus switched off in the low power mode. Thus, these circuits may lose their configuration during the low-power mode. For example, in various embodiments, the processing system comprises also an oscillator and reset circuit configured to generate a reset for the first sub-circuit when the first supply voltage is switched on. For example, in various embodiments, the digital processing unit may be a microprocessor, preferably a CPU, comprising a plurality of registers. In this case, the plurality of register of the microprocessor and the general-purpose input/out register may be reset in response to the reset signal.

Accordingly, setting the second control signal directly in response to the wake-up event, may imply that the latches take the unprogrammed/reset values in the general-purpose input/out register. Accordingly, in case the configuration of the pad has to be changed, the software instructions executed by the digital processing unit do not only comprise the one or more commands for activating the low-power mode, but after a start-up of the system, also instructions for programming the general-purpose input/out register and only then the command for reactivating the plurality of latches.

Accordingly, in various embodiments, the processing system according to the present disclosure may be operated in the following manner.

At first the input voltage is provided to the power supply circuit, whereby the power supply circuit generates the first supply voltage for the first sub-circuit and the second supply voltage for the second sub-circuit.

Next, the digital processing unit programs a first time configuration data to the general-purpose input/out register and (e.g., after having executed given tasks) sends the one or more commands for activating the low-power mode to the power management circuit. Accordingly, the power management circuit sets the second control signal to indicate that the plurality of latches should maintain the configuration data, sets the third control signal to disconnect the general-purpose input/out register from the inputs of the plurality of latches, and sets the first control signal to switch off the first supply voltage.

Next, the power management circuit monitors the one or more wake-up signals in order to determine a wake-up event. In response to determining the wake-up event, the power management circuit sets the first control signal in order to switch on the first supply voltage, thereby activating the normal operating mode, and sets the third control signal to connect the general-purpose input/out register to the inputs of the plurality of latches.

Accordingly, the power supply circuit provides again the first supply voltage to the first sub-circuit and the processing unit and the general-purpose input/out register are switched on. Accordingly, in response to activating the normal operating mode, the digital processing unit may program a second time (the same or different) configuration data to the general-purpose input/out register and only at this point sends the command for reactivating the plurality of latches to the power management circuit, whereby the power management circuit sets the second control signal to indicate that the plurality of latches should again provide the configuration data applied to the input terminals of the latches.

In case the content of registers of a microprocessor has to be maintained, the second sub-circuit may comprise a volatile memory, and the microprocessor/CPU may be configured to execute:

prior to sending the one or more commands for activating the low-power mode, instructions for storing the content of the registers of the microprocessor to given locations in the volatile memory, and after a reset of the microprocessor, instructions for reading the content of the given locations in the volatile memory and storing this content to the registers of the microprocessor.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
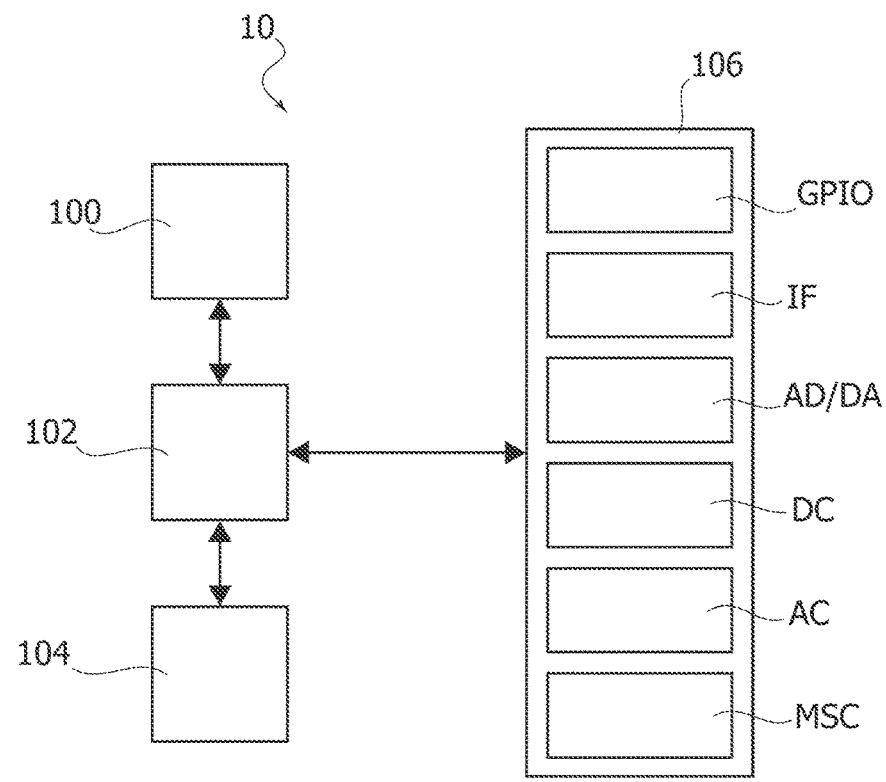
FIG. 1 shows an example of a processing system.
Figure 2:
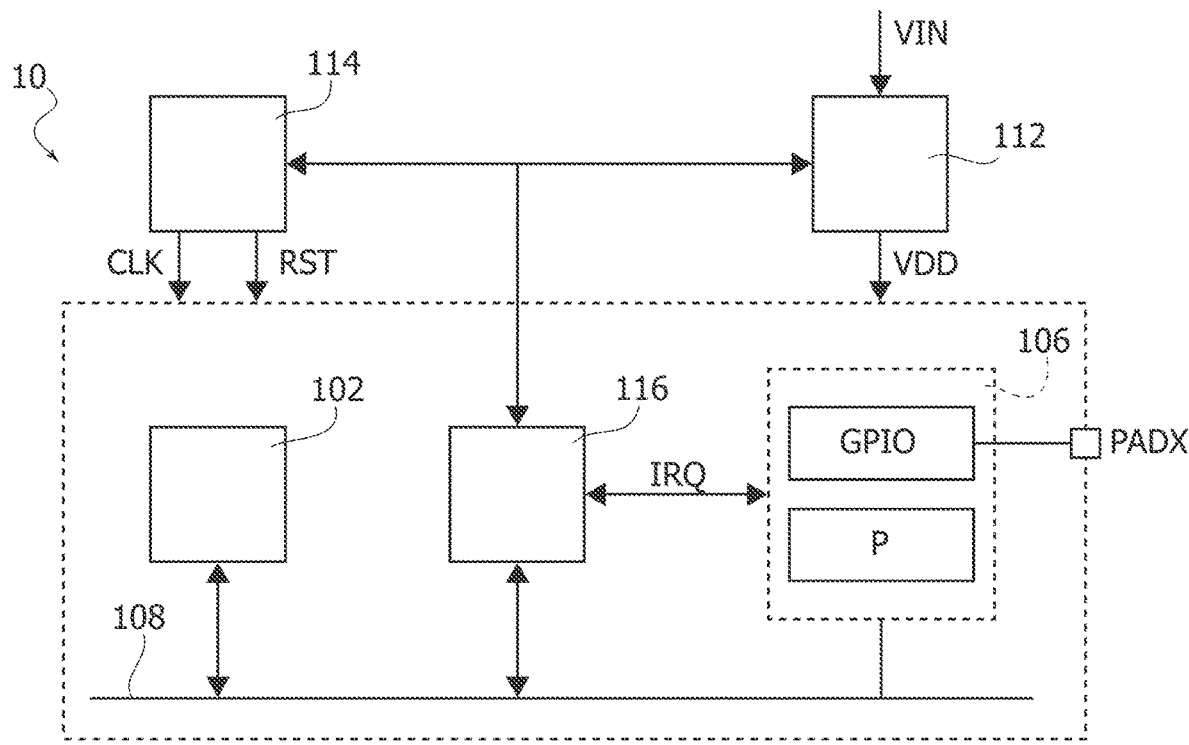
FIG. 2 shows an example of a processing system comprising a power management circuit.

In the following FIG. 3 to 9 parts, elements or components which have already been described with reference to FIGS. 1 and 2 are denoted by the same references previously used in such Figures; the description of such previously described elements will not be repeated in the following in order not to overburden the present detailed description.

As described in the forgoing with respect to FIGS. 1 and 2, in many applications, a digital processing system 10 should be able to activate a normal and a low-power mode. Preferably, unused components of the digital processing system 10 should be able to be switched off in the low-power mode, while the General-Purpose Inputs/Outputs GPIO should maintain their configuration.

Figure 3:
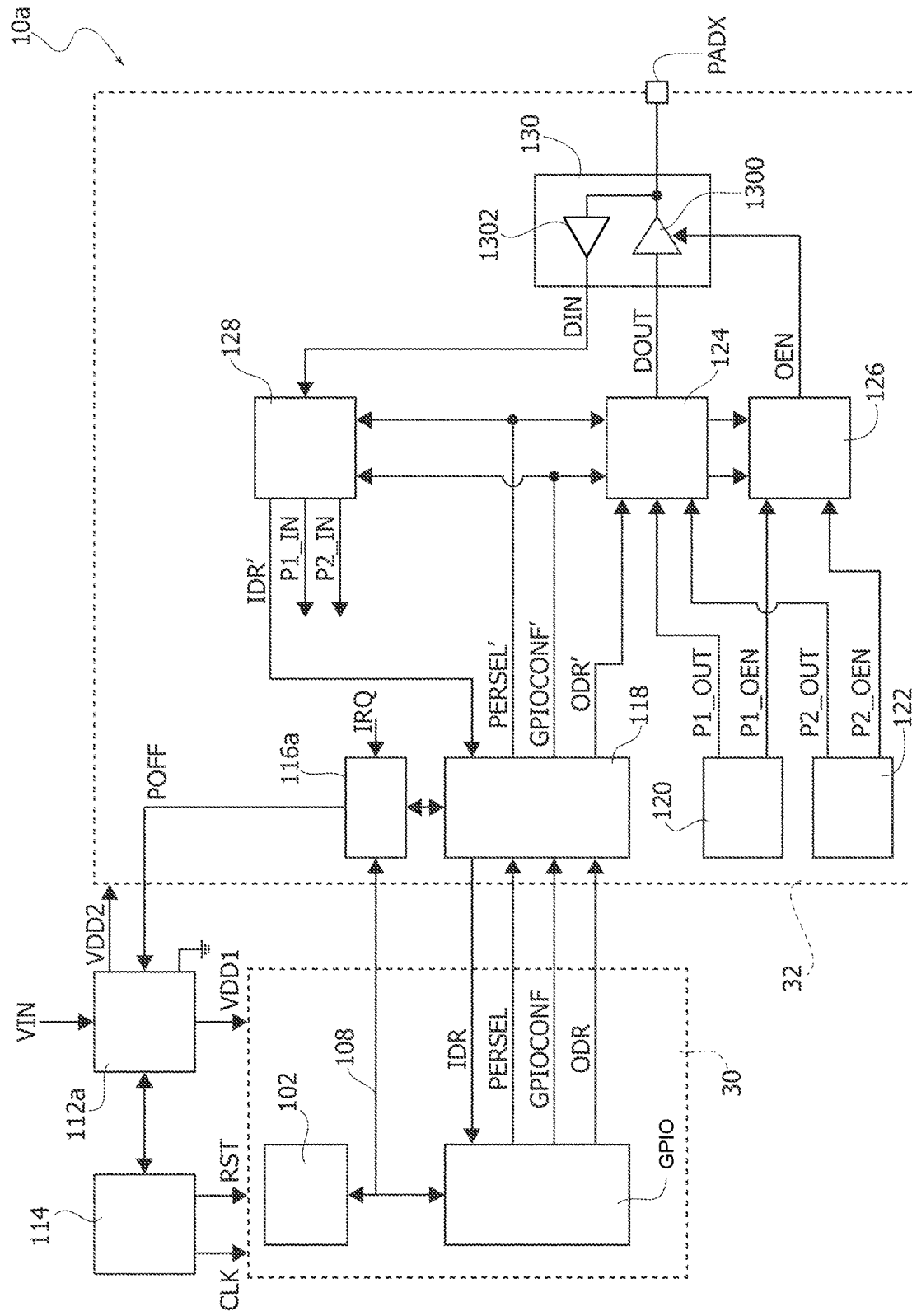
FIG. 3 shows an embodiment of a processing system according to the present disclosure.

FIG. 3 shows an embodiment of a processing system boa in accordance with the present disclosure.

Specifically, in the embodiment considered, the processing system boa comprises:

a power supply circuit 112a configured to generate a first supply voltage VDD1 and a second supply voltage VDD2;

a reset and oscillator circuit 114 configured to generate at least one clock signal CLK and a reset signal RST;

a first sub-circuit 30 being supplied by the first supply voltage VDD1, wherein the first sub-circuit 30 comprises the processing unit 102, e.g., the microprocessor or CPU, of the processing system and a General-Purpose Input/Output controller GPIO; and a second sub-circuit 32 being supplied by the second supply voltage VDD2, wherein the second sub-circuit 30 comprises a plurality of n General-Purpose Input/Output pads PAD1 . . . PADn of the integrated circuit.

Generally, these pads PAD1 ... PADn of the die of the integrated circuit/SoC may be connected to respective pins of a package of the integrated circuit or may be connected (e.g., via wire-bonding) to a PCB.

As shown in FIG. 3, each of the pads PAD1 ... PADn (in FIG. 3 is shown a generic pad PADx) has associated a configurable Input/Output (I/O) circuit 130. Specifically, the Input/Output circuit 130 comprises:

- an output driver 1300 configured to set the logic level of the pad PADx as a function of a binary data signal DOUT and an output enable signal OEN; and
- an input buffer 1302 configured to set the logic level of a binary data signal DIN as a function of the voltage at the pad PADx.

For example, the output driver 1300 may be configured to:
- connect the pad PADx to ground, i.e., the reference voltage of the supply voltages VDD1 and VDD2, when the signal DOUT is set to low and the signal OEN has a first logic level (typically high);
- connect the pad PADx to the supply voltage VDD2, when the signal DOUT is set to high and the signal OEN has the first logic level; and
- disable the output of the output driver 1300, when the signal OEN has a second logic level (typically low).

Thus, in the embodiment considered, the output driver 1300 is configured as a three-state output driver (0 and 1 logic levels, and a high impedance state).

Conversely, the input buffer 1302, such as a Schmitt trigger, may be configured to:
- set the signal DIN to high, when the voltage at the pad PADx is greater than an upper threshold; and
- set the signal DIN to low, when the voltage at the pad PADx is smaller than a lower threshold.

In various embodiments, the logic levels of the signals DOUT and OEN are determined as a function of a plurality of bits, which may be programmed via the processing unit 102. For example, in the embodiment considered, the processing unit comprises a register interface GPIO, wherein the processing unit 102 is configured to read and/or write one or more bits of the registers of the interface GPIO. For example, in various embodiments, the registers GPIO are addressable in the memory space of the processing unit 102, e.g., in so called Special-Function Registers (SFR) of the microprocessor/CPU 102. For example, as schematically shown in FIG. 3, the register interface GPIO may be connected to the processing unit 102 via the bus system 108.

For example, each pad PADx may have associated:
- a bit ODR used to set the logic level of the signal DOUT; and
- one or more bits GPIOCONFIG used to set the signal OEN.

Thus, by programming the bits ODR and GPIOCONFIG of the interface GPIO, the processing unit 102 may set the logic level of the pad PADx. Similarly, the signal DIN may be stored in a bit IDR of the interface GPIO. Accordingly, by reading the bit IDR, the processing unit 102 may determine/read the logic level of the pad PADx.

Specifically, as will be described in greater detail in the following, in various embodiments, the processing system boa comprises a storage circuit 118 configured to store the values of the configuration signals provided by the interface GPIO, e.g., GPIOCONF and ODR, and provide respective stored values, e.g., GPIOCONF' and ODR', to the I/O interface 130.

As shown in FIG. 3, the signals DOUT and OEN may indeed be provided by selector circuits 124 and 126, respectively. Similarly, the signal DIN may be provided via a selector circuit 128 to a plurality of circuits.

For example, the circuit 124, 126 and 128 are useful in case the processing system 10 comprises also one or more resources 106 configured to directly exchange data with the Input/Output circuit 130. For example, in FIG. 3 are shown two generic resources 120 and 122, such as communication interfaces.

For example, the circuit 120 is configured to:
- generate an output signal P1_OUT and an output-enable signal P1_OEN; and/or
- receive an input signal P1_IN.

Similarly, the circuit 122 is configured to:
- generate an output signal P2_OUT and an output-enable signal P2_OEN; and/or
- receive an input signal P2_IN.

Generally, the wording "and/or" highlights that the circuits 120 and 122 may also only receive data or only transmit data. For example, in this case, the respective output-enable signal may also be hard-wired.

Accordingly, in this case, the selector circuit 124 may be configured to generate the signal DOUT by selecting the signal ODR' (provided by the storage circuit 118) or one of the output signals provided by the resources 120 and 122. Similarly, the selector circuit 126 may be configured to generate the signal OEN as a function of one or more of the configuration bits GPIOCONF' (provided by the storage circuit 118) or one of the output-enable signals provided by the resources 120 and 122. Finally, the circuit 128 may be configured to provide the signal DIN to the storage circuit 118 (via a signal IDR', which is then provided to the interface GPIO as signal IDR) or one of the resources 120 and 122.

For example, in various embodiments, the selections performed within the circuits 124, 126 and 128 are controlled via one or more bits PERSEL in the register GPIO, and optionally one or more of the bits GPIOCONFIG in the register GPIO. Specifically, also in this case, the storage circuit 118 may receive these signals and provide a signal PERSEL' and optionally a signal GPIOCONFIG'.

In the following will now be described a possible embodiment of the bits of each pad PADx in the controller registers GPIO.

In various embodiments, two bits GPIOCONF[1:0]: are used to configure the respective PADx as input or output or as a pad connected to a peripheral/resource. For example, the following bit mapping may be used:
- 00: PADx is configured as input;
- 01: PADx is configured as output;
- 1X: PADx is configured as peripheral I/O, where "X" indicates that the respective bit may be either 1 or 0.

Accordingly, in the embodiment considered, each PADx may be configure as input, output or peripheral I/O depending on the value of the respective two bits GPIOCONF[1:0].

In various embodiments, a given number of bits is used for the peripheral selection bits PERSEL. For example, in the embodiment considered are used two possible peripherals 120 and 122. Accordingly, a single bit may be sufficient, e.g.:
- 0: PADx is configured as peripheral 120; and
- 1: PADx is configured as peripheral 122.

As mentioned before, the width of the register is one bit because in the embodiment are considering only two peripherals. For example, for a number y of peripherals, the signal PERSEL should have at least $\log_2(y)$ bits.

Figure 5:
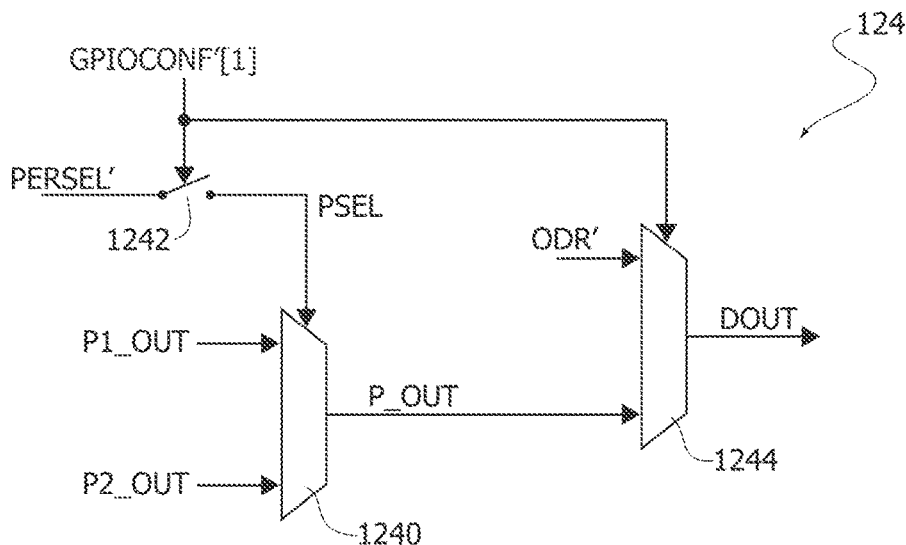
FIGS. 5, 6 and 7 shows embodiments of selector circuits of the processing system of FIG. 3.
Figure 6:
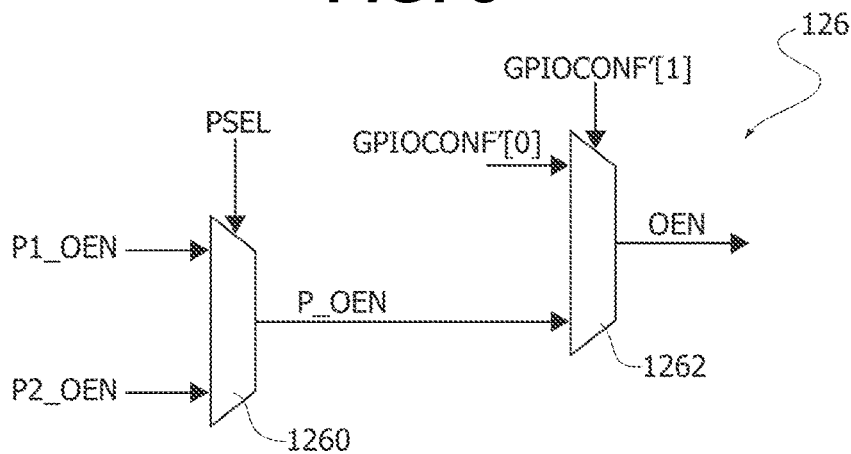
Figure 7:
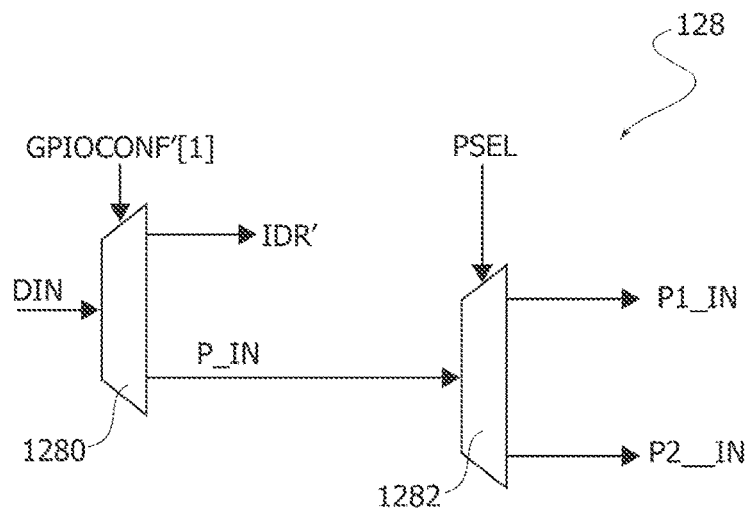

For example, FIGS. 5, 6 and 7 show possible embodiments of the selector circuits 124, 126 and 128, respectively.

For example, as shown in FIG. 5, a first multiplexer 1240 may be used to select, as a function of a signal PSEL, an output signal P_OUT amongst the output signals P1_OUT and P2_OUT provided by the peripherals 120 and 122. For example, the signal PSEL may correspond to the signal PERSEL' (provided by the storage circuit 118), or as shown in FIG. 5, the signal PSEL may correspond to the signal PERSEL' only when the respective bit GPIOCONF[1] (provided by the storage circuit 118) is also set to high (i.e., PADx is configured as peripheral I/O), as schematically shown via an electronic switch 1242. Accordingly, a further multiplexer 1244 may be used to select, as a function of the bit GPIOCONF[1], as signal DOUT either the signal ODR' (provided by the storage circuit 118) or the signal P_OUT.

Similarly, as shown in FIG. 6, the selector circuit 126 may comprise a first multiplexer 1260 configured to select, as a function of a signal PSEL, an output-enable signal P_OEN amongst the output-enable signals P1_OEN and P2_OEN provided by the peripherals 120 and 122. A further multiplexer 1262 may, thus, be used to select, as a function of the bit GPIOCONF'[1] (provided by the storage circuit 118), as signal OEN either the bit GPIOCONF'[0] (set to 0 when PADx is configured as input, and 1 when PADx is configured as output) or the signal P_OEN.

In a complementary manner, as shown in FIG. 7, the circuit 128 may comprise a demultiplexer 1280 configured to provide, as a function of the bit GPIOCONF'[1], the signal DIN as signal IDR (bit GPIOCONF'[1] is set to low) or as a signal P_IN (bit GPIOCONF'[1] is set to high). Moreover, a second multiplexer may be configured to provide, as a function of the signal PSEL, the signal P_ON as signal P1_ON or P2_ON to one of the peripherals 120 or 122.

Generally, based on the logic levels used for signals DIN, DOUT and OEN, an inversion of the logic level of one or more of the signals may be performed when exchanging the signals between the circuits 118, 120 and 122 with the I/O interface 130. For example, in various embodiments, the multiplexer 1264 may receive not the signal ODR' but the inverted version of the signal ODR' provided by the storage circuit 118.

Specifically, as mentioned before, the processing system boa comprises a first sub-circuit 30 supplied by the voltage VDD1 and a second sub-circuit 32 supplied by the voltage VDD2. Specifically, as also shown in FIG. 3:
the first sub-circuit 30 comprises the microprocessor 102 and the register interface GPIO; and
the second sub-circuit 32 comprises the I/O interface 130 and the blocks 120, 122, 124, 126 and 128.

As shown schematically in FIG. 3, in various embodiments, the processing system boa comprises a power management circuit 116a, which may be configured via software instructions executed by the processing unit 102. Specifically, the power management circuit 116a is in the sub-circuit 32 and thus powered via the supply voltage VDD2. For example, in order to exchange data with the processing unit 102, the power management circuit 116a may comprises one or more registers, which are programmable via the processing unit 102. For example, in FIG. 3, the power management circuit 116a is connected to the bus system 108.

For example, in various embodiments, the power management circuit 116a may be configured to:
activate a low-power mode once the processing unit 102 sends a given command, e.g., programs a given bit of a register interface of the power management circuit 116a; and resume a normal operating mode in response to one or more wake-up event, such as the change of the logic level or a trigger in a wake-up signal IRQ.

For example, when activating the low-power mode, the power management circuit 116a may set one or more signals POFF (e.g., high), which are provided to the power supply circuit 112a and optionally the oscillator and reset circuit 114, e.g., in order to perform at least one of the following operations:
switch off the supply voltage VDD1 for the sub-circuit 30;
reduce the frequency of the clock signal CLK generated by the oscillator circuit 114;
deactivate the clock signal provided to the sub-circuit 30.
Specifically, in various embodiments, the processing system boa may comprise:
a first oscillator and reset circuit 114 in the sub-circuit 30 and thus powered via the supply voltage VDD1; and
a second oscillator and reset circuit 114 in the sub-circuit 32 and thus powered via the supply voltage VDD2.

Thus, in this case, when switching off the supply voltage VDD1, also the first oscillator and reset circuit 114 is switched off, thereby deactivating the clock signal provided to the sequential logic circuits of the sub-circuit 30. Conversely, the sequential logic circuits of the sub-circuit 32 still receive a clock signal from the second oscillator and reset circuit 114. For this reason, in various embodiments, the oscillator of the second oscillator and reset circuit 114 has a lower frequency than the oscillator of the first oscillator and reset circuit 114.

In case the power management circuit 116a supports a plurality of modes, the register interface of the power management circuit 116a may comprise one or more bits MODE for selecting at least one of the above modes to be used in the low-power mode (see also FIG. 9, which will be described in greater detail in the following).

Generally, in response to the wake-up event, the power management circuit 116a may thus resume the previous operating mode, e.g.:
switch on the supply voltage VDD1 for the sub-circuit 30; and
activate the clock signal provided to the sub-circuit 30.
In various embodiments, the wake-up signal IRQ used to resume the normal-operating mode may be generated by any circuit within the sub-circuit 32, e.g.:
the power management circuit 116a may be configured to determine whether one or more of the signals DIN provided by the I/O interfaces 130 or the signals IDR' provided by the circuits 128 changes the logic level (e.g., from high to low, or from low to high); and/or
the wake-up signal IRQ may be generated by one or more of the peripherals 120 and 122.

In case the power management circuit 116a supports a plurality of wake-up sources, the register interface of the power management circuit 116a may comprise one or more bits WEN for selecting which wake-up signal should indeed be enabled for resuming the normal operating mode (see also FIG. 9, which will be described in greater detail in the following).

Accordingly, in various embodiments, the peripherals, which should remain switched on in the low-power mode, e.g., for generating a wake-up signal IRQ used to resume the normal operating mode, are supplied by the supply voltage VDD2 in the sub-circuit 32.

As shown in FIG. 3, the register interface GPIO of the general-purpose inputs/outputs is in the sub-circuit 30 and thus supplied by the voltage VDD1. Accordingly, when switching off the supply voltage VDD1, the register interface GPIO loses its configuration. However, this implies that also the various configuration signals provided by the circuit GPIO, such as the signals GPIOCONF, ODR and PRESEL, would lose their value.

Accordingly, in various embodiments, the processing system boa comprises the previously mentioned storage circuit 118 configured to store the values of the configuration signals, e.g., GPIOCONF, ODR and PRESEL, and provided respective stored values, e.g., GPIOCONF', ODR' and PRESEL', to the I/O interface 130 and the selection circuit 124, 126 and 128. Specifically, in the embodiment considered, the storage circuit 118 is in the sub-circuit 32 and thus powered via the supply voltage VDD2.

Figure 4:
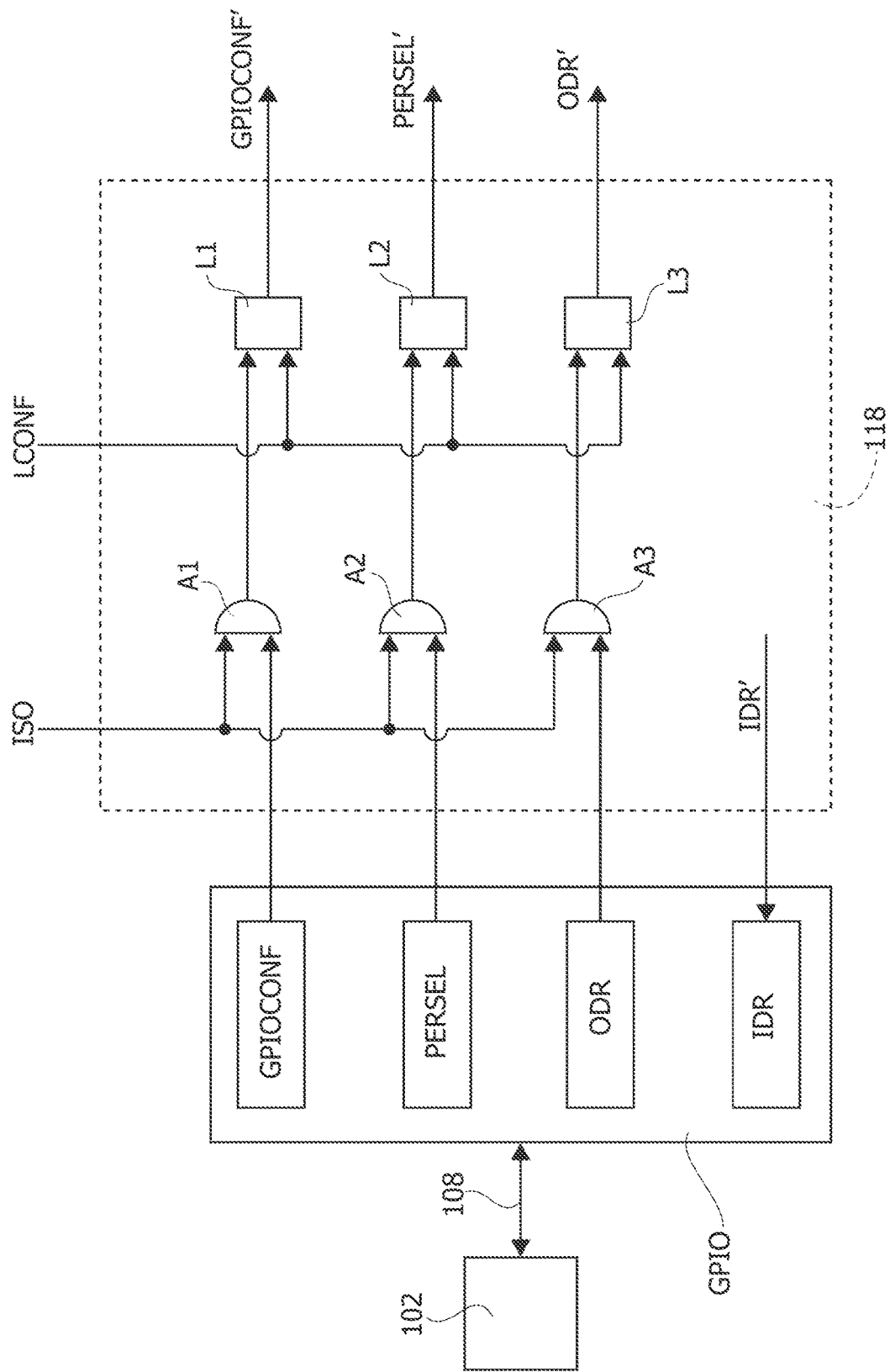
FIG. 4 shows an embodiment of a storage circuit of the processing system of FIG. 3.

For example, FIG. 4 shows a possible embodiment of the storage circuit 118.

As mentioned before, the register interface GPIO may be programmed via the processing unit 102. In various embodiments, the register interface GPIO may also be directly integrated in the processing unit 102. For example, as mentioned before, the register interface may comprise the following bits for each of the pads PAD1 . . . PADn:
 writeable (and optionally readable) bits GPIOCONF for setting mode of the respective pad PADx (input, output, or optionally connection to a peripheral);
 writeable (and optionally readable) bits PERSEL for selecting a peripheral 120 or 122 to be connected to the respective pad PADx;
 a writeable (and optionally readable) bit ODR for setting the value of the respective pad PADx (high or low) when the pad is configured as output; and
 a readable bit IDR indicating the logic level of the respective pad PADx.

In various embodiments, the storage circuit 118 is configured to store the bits of the register interface GPIO, which are used to configure the I/O interfaces 130. For example, in the embodiment considered, the storage circuit 118 is configured to store the values of the bits GPIOCONF, PERSEL and ODR, thereby providing stored versions of these bits GPIOCONF', PERSEL' and ODR'.

Specifically, in various embodiments, the storage circuit 118 comprises for each configuration bit to be stored a respective storage element, such as a latch, such as a D type latch. Specifically, in various embodiments, the storage elements do not use a clock signal, thereby avoiding significant delays between the programming of a bit in the register interface GPIO and the propagation to the I/O interface 130. For example, in FIG. 4 are shown latches L1, L2 and L3 for storing the bits of the signals GPIOCONF, PERSEL and ODR, and wherein these latches provide the signals GPIOCONF', PERSEL' and ODR'. In some embodiments, e.g., latch L1 may include a plurality of latches (e.g., for GPIOCONF'[0], GPIOCONF'[1]).

Specifically, in the embodiment considered, the storage elements are configured to:
 provide the logic level of a signal applied to the respective input when a signal LCONF has a first logic level (e.g., high); and
 maintain the logic level when the signal LCONF has a second logic level (e.g., low).

Moreover, in various embodiments, each configuration bit is provided to the input of a respective storage element (L1 . . . L3) via a respective switching element/circuit configured to provide the configuration bit to the respective storage element (L1 . . . L3) when a signal ISO has a given logic value (e.g. high). For example, in the embodiment considered, the switching elements are implemented with isolation cells, schematically shown as logic AND gates, i.e., isolation cells A1, A2 and A3 for the storage elements L1, L2 and L3. Isolation cells are well known in the art, and reference can be made, e.g., to U.S. Pat. Nos. 7,167,017 B2 or 6,977,833 B2, the content thereof being incorporated herein by reference. In general, the isolation cells may also be implemented with electronic switches or transmission gates.

Accordingly, in the embodiment considered, each configuration bit may be stored selectively in a respective storage element (L1, L2, L3) as a function of two signals:
 a first signal LCONF, which selectively enables or disable the storage of a signal provided to the input of the storage element; and
 a second signal ISO, which selectively provides the configuration bit to the input of the respective storage element.

Thus, in some embodiments, when signal LCONF has the first logic level (e.g., high), the respective logic value from the isolation cells (e.g., A1, A2, A3) are propagated by the respective storage elements (e.g., L1, L2, L3) to circuits 124, 126, and 126; and when signal LCONF has the second logic level (e.g., low), the logic values stored in the latches (e.g., of L1, L2, L3), maintain their respective values and the latches (e.g., L1, L2, L3) provide such stored values to circuits 124, 126, and 126. In some embodiments, the logic values stored in the latches when the signal LCONF has the second logic level (e.g., low) correspond to the last logic value at the respective input of the latch (e.g., L1, L2, L3) when the signal LCONF had the first logic level (e.g., high).

As shown in FIG. 4, the signal IDR' provided by the circuit 128 may be provided directly to the respective bit IDR in the register interface GPIO.

Accordingly, in the embodiment considered, the power management circuit 116*a* is configured to also generate the signals ISO and LCONF.

Figure 8:
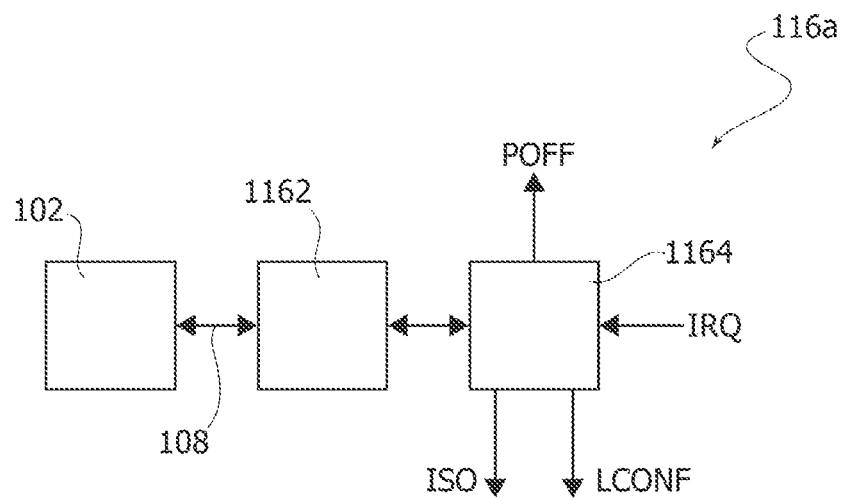
FIGS. 8 and 9 shows an embodiment of a power management circuit of the processing system of FIG. 3.

For example, FIG. 8 shows a possible embodiment of the power management circuit 116*a*.

Specifically, in the embodiment considered, and as mentioned before, the power management circuit 116*a* is powered via the supply voltage VDD2 and comprises:
 a register interface 1162 programmable via the processing unit 102; and
 a control circuit 1164.

Specifically, in various embodiments, the control circuit 1164 is a sequential logic circuit (such as a finite state machine) or preferably a combinational logic circuit configured to generate, as a function of the configuration data stored to the register interface 1162 and one or more wake-up signals IRQ:
 the signal POFF for the power supply circuit 112*a* and optionally the oscillator and reset circuit 114, and
 the signals ISO and LCONF for the storage circuit 118.

Figure 9:
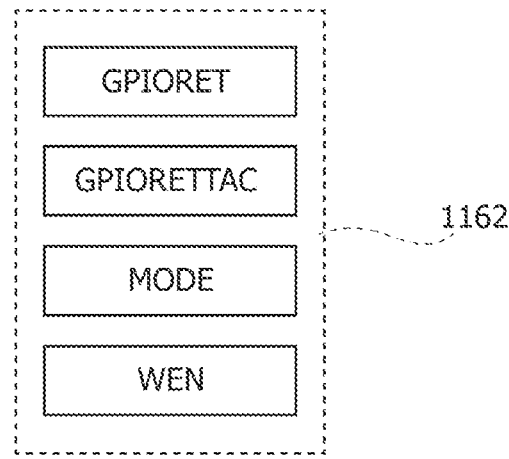

For example, as shown in FIG. 9, the register interface 1162 may comprise one or more of the following configuration data, which are programmable via the processing unit 102:
 one or more bits MODE for activating the low-power mode and optionally selecting a low-power mode to be activated;
 one or more optional bits WEN for enabling the wake-up sources used to resume the normal operating mode;
 a bit GPIORET indicating whether the storage circuit 118 should maintain the configuration data of the register interface GPIO when activating the low-power mode and exiting the low power mode or not;
 an optional bit GPIORETAC indicating whether the latches inside circuit 118 should become transparent (by setting the signal LCONF) automatically when resuming the normal operating mode.

Accordingly, in various embodiments, the control circuit 1164 may be configured to monitor the bit GPIORET and, in the normal operating mode, set the signals ISO and LCONF in order to provide the configuration bits of the register interface GPIO, e.g., by setting the signals ISO and LCONF to high.

Conversely, in response to determining that the configuration data MODE indicate that the low-power mode should be activated, the control circuit may set the signal POFF (e.g., high) in order to activate the (requested) low-power mode and:

in case the signals GPIORET is set, set the signals ISO and LCONF in order to maintain the configuration bits and isolate the latches L1-L3 from the interface GPIO, e.g., by setting the signals ISO and LCONF to low.

Generally, in case the signals GPIORET is not set, the processing system 10a may be configured to perform other operations. For example, in various embodiments, in this case, the power management circuit is configured to set the signals ISO and LCONF in order to make pass programmed register values from the interface GPIO to the PADx, e.g., by setting the signals ISO and LCONF to high. However, in this case, the power management circuit sets the signal POFF in order to just switch off the clock signal CLK of the first sub-circuit 30, while the supply voltage VDD1 remains switched on. For example, this mode may be used for debug purposes.

In various embodiments, in response to an enabled wake-up event IRQ, the control circuit 1164 may set the signal POFF (e.g., low) in order to activate the normal operating mode. In this case, the control circuit 1164 may also:

in case the signals GPIORETAC is not set, set the signals ISO and LCONF in order to maintain the configuration bits in the storage circuit 118, e.g., by setting the signal ISO to high and the signal LCONF to low; or in case the signals GPIORETAC is set, reset the storage circuit 118, e.g., by setting the signal ISO to high and the signal LCONF to high, whereby the reset configuration of the interface GPIO is provided by latches L1-L3.

A possible operation of the processing system will now be described. After start-up of the processing system (VIN is activated), the power supply circuit 112a generates the supply voltages VDD1 and VDD2. Generally, in case the voltages VDD1 and VDD2 correspond to the voltage VIN, the power supply circuit 112a may also be implemented via one or more electronic switches driven as a function of the signal POFF. Accordingly, the oscillator and reset circuit 114 is activated and the reset signal RST is generated, thereby resetting the sub-circuit 30 of the processing system boa. Moreover, the oscillator and reset circuit 114 generates the clock signal CLK, whereby the processing unit 102 starts to execute the respective firmware stored to the program memory 104.

Typically, such a firmware comprises software instructions for configuring the various pads PAD1 . . . PADn, i.e., the I/O interface 130. For this purpose, the firmware comprises typically software instructions for programming the configuration bits in the register interface GPIO.

Moreover, such a firmware may comprise a software instruction for activating a low-power mode, e.g., by programming the configuration data in the register interface 1162, in particular the data MODE.

Specifically, in the following will be assumed that the firmware comprises a software instruction setting the mode data MODE in order to indicate that the supply voltage VDD1 (and optionally the oscillator and reset circuit 114) should be switched off, which will be referred to in the following as DEEPSTOP mode. Generally, the DEEPSTOP mode may also be the only supported mode and the DEEPSTOP mode may be activated by setting a single mode bit MODE.

In various embodiments, the firmware comprises one or more software instruction for setting one or more of these bits. Thus, in the following will be assumed that, prior to activating the low-power mode, the firmware programs also the bit GPIORET.

In response to detecting that the DEEPSTOP mode should be activated (by monitoring the configuration bits MODE), the control circuit verifies thus the bit GPIORET and determines that the configuration data of the I/O pads should be stored.

Accordingly, in this case, the control circuit 1164 may be configured to perform the following operations in sequence:

set the signal LCONF (e.g., to low) to indicate that the storage elements L1 . . . L3 should maintain the configuration data;

set the signal ISO (e.g., to low) in order to disconnect the register interface GPIO from the elements L1 . . . L3;

set the signal POFF in order to switch off the supply voltage VDD1 (via the power supply circuit 112a).

Generally, the sequential operation of the control circuit 1164 may be implemented via a sequential logic circuit or by using a combinational logic circuit comprising a series of delay elements. Generally, the power management circuit 116a may also be a sequential logic circuit operating in response to the clock signal CLK, which could also be switched off, because the setting of the signal POFF is the last operation.

Moreover, the sequence of operation may also be implicit due to the sequence of software instructions, i.e., the processing unit 102 may first program the bit GPIORET, whereby the control circuit 1164 sets the signal LCONF (e.g., to low) to indicate that the storage elements L1 . . . L3 should maintain the configuration data, and then program the bit(s) MODE, whereby the control circuit 1164 sets the signal ISO (e.g., to low) in order to disconnect the register interface GPIO from the elements L1 . . . L3. Accordingly, the signal LCONF and ISO may be determined as a function of the signal GPIORET and the signal MODE, at least one or more respective bits indicating that the low-power mode should be started. For example, this bit may correspond to the CPU instruction WFI (Wait for Interrupt).

Accordingly, in response to the signal POFF, the power supply circuit switches 112a of the voltage VDD1, and optionally the oscillator and clock circuit 114 switches off the clock signal CLK. However, the storage circuit 118 still provides the configuration data to the I/O interface 130.

For example, in case the firmware has set the register GPIOCONF (of a given pad PADx) to "01" and the respective bit ODR to "1", the storage circuit will provide the stored values GPIOCONF'="01" and ODR'="1". Accordingly, the selector circuits 1244 and 1262 will provide the signals DOUT="1" and OEN'="1", respectively, to the output driver 1300, and the respective pad PADx is set to high and will maintain its value also in the DEEPSTOP mode. In the embodiment considered, the input comparator 1302 is always on, whereby the signal DIN is set to "1", and the selector circuit 1280 sets the signal IDR' to "1".

Conversely, in case the firmware has set the register GPIOCONF (of a given pad PADx) to "10" or "11", the selector circuits 1244 and 1262 will provide the signals DOUT=P_OUT and OEN'=P_OEN, and the selector circuits 1240 and 1260 will select:
- as signal P_OUT one of the signals P1_OUT and P2_OUT as a function of the signal PERSEL, and optionally the signal GPIOCONF; and
- as signal P_OEN one of the signals P1_OEN and P2_OEN as a function of the signal PERSEL, and optionally the signal GPIOCONF.

Moreover, the selector circuit 1280 forwards the signal DIN to one of the signals P1_IN and P2_IN as a function of the signal PERSEL, and optionally the signal GPIOCONF.

Accordingly, in this case, a selected peripheral 120 or 122 may exchange data via the pad PADx, e.g., set the logic value of the pad PADx or read the logic value of the pad PADx. For example, for exchanging data, such peripherals may require a clock signal. Accordingly, in various embodiments, the sub-circuit 32 receives a clock signal, while the clock signal provided to the sub-circuit 30 may be switched off. For example, for this purpose the processing system boa may comprise:
- two oscillator and reset circuits 114;
- an oscillator and reset circuits 114 comprising two oscillators; or
- an oscillator and reset circuits 114 comprising an oscillator (preferably with a clock frequency settable as a function of the signal POFF), wherein the clock signal is provided always to the sub-circuit 32, and to the sub-circuit 30 selectively as a function of the signal POFF. As mentioned before, in various embodiments, the operation of the clock and reset circuit 114 may be configurable via the mode data MODE.

Once having activated the low-power mode, the power management circuit 116a monitors the enabled wake-up signals. As mentioned before, for this purpose, the firmware may comprise instructions for programming the configuration data WEN indicating, which wake-up sources may reactivate the processing system 10a.

Accordingly, once the power management circuit 116a detects that a given enabled wake-up event/signal IRQ is set, the control circuit 1164 may be configured to perform the following operations, which may be performed in parallel or in sequence:
- set the signal POFF in order to switch on the supply voltage VDD1 (via the power supply circuit 112a);
- set the signal ISO (e.g., to high) in order to connect the register interface GPIO to the storage elements L1 ... L3.

Accordingly, in the embodiment considered, the power management circuit 116a does not change the logic level of the signal LCONF when resuming the normal operating mode. For example, for this purpose, the signal LCONF may correspond to the inverted version of the bit GPIORET. In general, by using opposite logic levels, for the signal GPIORET, the signal LCONF may also correspond to the signal GPIORET.

Accordingly, in the embodiment considered, the register interface GPIO is powered via the supply voltage VDD1 and does not comprise retention flip-flops. Accordingly, the respective configuration is lost when activating the DEEP-STOP mode. Conversely, the storage circuit 118 and the registers 1162 of the power management circuit 116a are within the sub-circuit 32, which remains powered via the supply voltage VDD2 and remains thus active.

In various embodiments, the firmware executed by the processing unit 102 comprises, thus, instructions for reprogramming the register interface GPIO and only then an instruction for changing the logic level of the bit GPIORET by programming the register interface 1162.

For example, the processing circuit 10a shown in FIG. 3 has the advantage that also the processing unit 102 does not use retention flip-flops.

For example, in response to resuming the normal operating mode, the oscillator and reset circuit 114 may generate a reset, whereby a new start of the processing unit 102 is performed. For example, in response to this reset, the firmware may comprise an instructing for perform one or more tasks, such as reading data from a sensor and transmitting such data, and then activate again the low-power mode. Additionally or alternatively, the firmware may comprise instructions for determining which interrupt IRQ has been generated for resuming the normal operating mode, and then perform one or more tasks as a function of the determined interrupt.

In case, a given processing state of the processing unit has to be maintained, the firmware may comprise instructions for storing data identifying the state of the processing unit 102 to a memory configured to maintain its configuration when the supply voltage VDD1 is deactivated. For example, for this purpose the memory may be a programmable non-volatile memory, such as the memory 104, or a volatile memory, e.g., the memory 100, powered via the supply voltage VDD2. Accordingly, in response to the reset generated by the circuit 114 when resuming the normal operating mode, the firmware may comprise instructions for reading the data identifying the state of the processing unit 102 from the memory, and then perform one or more tasks as a function of the read data.

In various embodiments, the processing system boa may also be configured, either via software instructions executed via the processing unit 102 or via the hardware power management circuit 116a, to store the complete context of the processing unit 102. Generally, the term "context" refers to the content of the registers of the processing unit 102 (in the sub-circuit 30). In fact, as mentioned before, in various embodiments, the memory 100 may be powered via the supply voltage VDD2 and thus maintains its data. Accordingly, in response to resuming the normal operating mode, the processing system 10a (either via firmware or via the hardware power management circuit 116a) may read the context again from the memory.

For example, resuming the complete context involves that also the configuration of the register interface GPIO is restored. Accordingly, in case the user wants to change the configuration of one or more PADs, it is sufficient to reprogram the new configuration data to the register interface GPIO and then change the logic level of the configuration data GPIORET.

Conversely, in the embodiment considered, in case the configuration of the register interface GPIO is lost and a user wants to change the configuration of the I/O interfaces, e.g., for changing the logic level of a pad, the firmware has to comprise instructions both for providing the new configuration of given pads PADx to the register interface GPIO and the configuration data of the other pads PADx (which remain unchanged).

As mentioned before, in various embodiments, the configuration register 1162 may also comprise the bit GPIORETAC. Specifically, when this bit is set, the power management circuit 116a may be configured to render the storage circuit 118 transparent when resuming the normal operating mode, e.g., by setting the signal LCONF to high as a function of the bit GPIORETAC. For example, this behavior may be useful in case the processing system boa gets stuck for some reasons during DEEPSTOP or waking up from DEESPTOP, and a user wants to acquire again dynamic control of one or more pads PAD1 . . . PADn, making the latches transparent again and using a JTAG or Single Wire interface for debugging.

Accordingly, with the arrangements described herein the processing system is able to handle one or more general-purpose input-output in low power mode and exiting low power mode, without losing their configuration even if controller GPIO does not comprise retention flip-flops. Specifically, for this purpose is used a combined solution, which comprises:

a storage circuit 118 and a power management circuit 116*a*; and software instructions for storing the configuration to the storage circuit 118, activating the DEEPSTOP mode and, in response to resuming the normal operation mode, reprogramming the I/O configuration and rendering the storage element circuit 118 again transparent.

Accordingly, power consumption in the low power mode may be reduced and the amount of area needed for retention flip-flops may be avoided. Moreover, a complex routing of two supply voltages to such retention flip-flops may be avoided. In fact, in various embodiments, the register interface GPIO may be arranged near (or even within) the microprocessor 102, which thus may be an existing integrated circuit layout, such as an IP core, while the sub-circuit 32 may be provided as an additional separate integrated circuit layout.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A processing system comprising:
a first pad;
first and second sub-circuits;
a power supply circuit configured to receive an input voltage and generate first and second supply voltages, wherein the first sub-circuit is configured to be supplied by the first supply voltage and the second sub-circuit is configured to be supplied by the second supply voltage, wherein the power supply circuit is configured to selectively switch off the first supply voltage as a function of a first control signal;
wherein the first sub-circuit comprises:
a general-purpose input/out register configured to receive a first data input signal and provide configuration data comprising a first output enable signal, a first data output signal, and a peripheral selection signal; and
wherein the second sub-circuit comprises:
an input/output interface comprising:
an output driver configured to be enabled via an output enable signal, the output driver configured, when enabled, to apply a voltage to the first pad as a function of the logic level of a binary data output signal, and
an input buffer configured to generate a binary data input signal as a function of the voltage at the first pad,
at least one peripheral configured to receive a second data input signal and provide a second output enable signal and a second data output signal, a storage circuit comprising:
a plurality of latches configured to provide stored configuration data comprising a stored first output enable signal, a stored first data output signal and a stored peripheral selection signal, wherein the plurality of latches is configured to provide or maintain configuration data applied to inputs of the plurality of latches as a function of a second control signal, and
for each of the plurality of latches, a respective isolation cell configured to selectively connect the general-purpose input/out register to the input terminals of the plurality of latches as a function of a third control signal to selectively provide the configuration data to the inputs of the plurality of latches,
a first selection circuit configured to determine a logic level of the data output signal as a function of the stored first data output signal, the second data output signal, and the stored peripheral selection signal,
a second selection circuit configured to determine the logic level of the output enable signal as a function of the stored first output enable signal, the second output enabled signal, and the stored peripheral selection signal,
a third selection circuit configured to provide the data input signal as the first data input signal or the second data input signal as a function of the stored peripheral selection signal, and
a power management circuit configured to manage a normal operating mode and a low-power mode, wherein the power management circuit is configured to:
receive one or more commands for activating the low-power mode,
in response to receiving the one or more commands for activating the low-power mode:
set the second control signal to a first state of the second control signal to indicate that the plurality of latches should maintain the configuration data,
set the third control signal to a first state of the third control signal to disconnect the general-purpose input/out register from the inputs of the plurality of latches, and
set the first control signal to a first state of the first control signal to switch off the first supply voltage,
monitor one or more wake-up signals to determine a wake-up event, and
in response to determining the wake-up event:
set the first control signal to a second state of the first control signal to switch on the first supply voltage to activate the normal operating mode,
set the third control signal to a second state of the third control signal to connect the general-purpose input/out register to the inputs of the plurality of latches,
receive a command for reactivating the plurality of latches, and
in response to receiving the command for reactivating the plurality of latches, set the second control signal to a second state of the second control signal to indicate that the plurality of latches should provide the configuration data.

2. The processing system of claim 1, wherein the first selection circuit is configured to select the stored first data output signal or the second data output signal as the data output signal as a function of the stored peripheral selection signal.

3. The processing system of claim 1, wherein:
the at least one peripheral comprises a first peripheral and a second peripheral, wherein the first peripheral is configured to receive a third data input signal and provide a third output enable signal and a third data output signal, wherein the second peripheral is configured to receive a fourth data input signal and provide a fourth output enable signal and a fourth data output signal;
the first selection circuit is configured to select the third data output signal or the fourth data output signal as the second data output signal as a function of the stored peripheral selection signal; and
the second selection circuit is configured to select the third output enable signal or the fourth output enable signal as the second output enable signal as a function of the stored peripheral selection signal.

4. The processing system of claim 1, wherein the at least one peripheral comprises a communication interface.

5. The processing system of claim 1, wherein the power management circuit comprises a further register comprising first configuration data and second configuration data, wherein the second control signal is determined as a function of the first configuration data, and the first control signal and the third control signal are determined as a function of the second configuration data, and wherein the one or more commands for activating the low-power mode comprise:
a first command for programming the first configuration data to set the second control signal to indicate that the plurality of latches should maintain said configuration data; and
a second command for programming the second configuration data to set the third control signal to disconnect the general-purpose input/out register from the inputs of the plurality of latches and the first control signal to switch off the first supply voltage, wherein the command for reactivating the plurality of latches comprises a third command for programming the first configuration data to set the second control signal to indicate that the plurality of latches should provide the configuration data.

6. The processing system of claim 5, wherein the first sub-circuit further comprises a digital processing unit configured to be programmed via software instructions, and wherein the further register is configured to be programmed via the digital processing unit.

7. The processing system of claim 5, wherein the further register comprises third configuration data, and wherein the power management circuit is configured to:
receive a plurality of wake-up signals;
select a sub-set of the wake-up signals as a function of the third configuration data; and
monitor the selected sub-set of wake-up signals to determine the wake-up event.

8. The processing system of claim 1, wherein the first sub-circuit further comprises a digital processing unit configured to be programmed via software instructions, wherein the general-purpose input/out register is configured to be programmed via the digital processing unit, wherein receiving the one or more commands for activating the low-power mode comprises receiving one or more commands from the digital processing unit, and wherein receiving the command for reactivating the plurality of latches comprises receiving the command from the digital processing unit.

9. The processing system of claim 8, wherein the processing system comprises an oscillator and reset circuit configured to generate a reset signal when the first supply voltage is switched on, wherein the digital processing unit comprises a microprocessor comprising a plurality of registers, and wherein the plurality of register of the microprocessor and the general-purpose input/out register are reset in response to the reset signal.

10. The processing system of claim 9, wherein the processing system comprises a non-volatile program memory having stored software instructions to be executed by the digital processing unit, wherein the stored software instructions comprise:
the one or more commands for activating the low-power mode;
instructions for programming the general-purpose input/out register; and
the command for reactivating the plurality of latches.

11. The processing system of claim 10, wherein the second sub-circuit comprises a volatile memory, wherein the stored software instructions comprise:
prior to the one or more commands for activating the low-power mode, instructions for storing a content of the plurality of register of the microprocessor to given locations in the volatile memory; and
after a reset of the microprocessor, instructions for reading the content of the given locations in the volatile memory and storing the content to the plurality of register of the microprocessor.

12. The processing system of claim 1, wherein the processing system in integrated in an integrated circuit.

13. The processing system of claim 1, wherein the second selection circuit is configured to select the stored first output enable signal or the second output enabled signal as the output enable signal as a function of the stored peripheral selection signal.

14. A method of operating a processing system, the method comprising:
generating a first supply voltage for a first sub-circuit and a second supply voltage for a second sub-circuit;
during a normal operating mode of the processing system, controlling an input/output interface based on content of a general-purpose input/out register of the first sub-circuit using a storage circuit of the second-sub-circuit, the storage circuit comprising a plurality of latches having inputs coupled to outputs of the general-purpose input/out register and outputs coupled to a selection circuit of the second sub-circuit for controlling the input/output interface;
receiving a request to enter a low-power mode of the processing system;
in response to receiving the request to enter the low-power mode,
settings a first control signal to a first state of the first control signal to maintain a state of the outputs of the plurality of latches,
setting a second control signal to a first state of the second control signal to disconnect the general-purpose input/out register from the inputs of the plurality of latches, and
turning off the first supply voltage;
during the low-power mode, controlling the input/output interface based on content of the plurality of latches and monitoring a wake-up signal to determine a wake-up event; and
in response to determining the wake-up event:
turning on the first supply voltage, setting the second control signal to a second state of the second control signal to connect the general-purpose input/out register to the inputs of the plurality of latches, the second state of the second control signal being different from the first state of the second control signal, and entering the normal operating mode.

15. The method of claim 14, further comprising, in response to entering the normal operating mode from the low-power mode, changing a content of the general-purpose input/out register; and after changing the content of the general-purpose input/out register, settings the first control signal to a second state of the first control signal and controlling the input/output interface based on the changed content of the general-purpose input/out register via the plurality of latches, wherein the second state of the first control signal is different from the first state of the first control signal.

16. The method of claim 14, wherein turning off the first supply voltage comprises setting a third control signal to a first state of the third control signal, and wherein turning on the first supply voltage comprises setting the third control signal to a second state of the third control signal that is different from the first state of the third control signal.

17. The method of claim 14, further comprising providing an input voltage to a power supply circuit, wherein generating the first and second supply voltages comprises generating, with the power supply circuit, the first supply voltage for the first sub-circuit and the second supply voltage for the second sub-circuit from the input voltage.

18. An integrated circuit comprising:

a first pad;

a power supply circuit configured to receive an input voltage and generate first and second supply voltages, wherein the power supply circuit is configured to selectively switch off the first supply voltage as a function of a first control signal;

a first sub-circuit configured to be powered by the first supply voltage, the first sub-circuit comprising a general-purpose input/out register having outputs having respective states based on a content of the general-purpose input/out register; and a second sub-circuit configured to be powered by the second supply voltage, the second sub-circuit comprising:

an input/output interface coupled to the first pad, the input/output interface having a plurality of operating modes, a storage circuit comprising:

a plurality of latches, and a plurality of isolation cells having outputs respectively coupled to inputs of the plurality of latches, and inputs respectively coupled to outputs of the general-purpose input/out register, wherein the plurality of isolation cells is configured to disconnected the inputs of the plurality of latches from the outputs of the general-purpose input/out register when a second control signal is in a first state of the second control signal, and connect the inputs of the plurality of latches to the outputs of the general-purpose input/out register when the second control signal is in a second state of the second control signal that is different from the first state of the second control signal, and wherein the plurality of latches is configured to:

provide, at the outputs of the plurality of latches, content from the inputs of the plurality of latches when a third control signal is in a first state of the third control signal, and maintain and provide at the outputs of the plurality of latches content stored in the plurality of latches when the third control signal is in a second state of the third control signal that is different from the first state of the third control signal, and a selection circuit configured to select an operation mode of the input/output interface from the plurality of operating modes based on the outputs of the plurality of latches.

19. The integrated circuit of claim 18, further comprising a power management circuit configured to manage a normal operating mode and a low-power mode, wherein the power management circuit is configured to:

in response to receiving a request to enter the low-power mode, set the third control signal to the second state of the third control signal, set the second control signal to the second state of the second control signal, and set the first control signal to a first state of the first control signal to turn off the first supply voltage; and during low-power mode, in response to determining a wake-up event, set the first control signal to a second state of the first control signal to turn on the first supply voltage, and set the second control signal to the first state of the second control signal.

20. The integrated circuit of claim 19, further comprising a digital processing unit configured to, when the third control signal is in the second state of the third control signal change the content of the general-purpose input/out register, and, after changing the content of the general-purpose input/out register, set the third control signal to the first state of the third control signal.

21. The integrated circuit of claim 18, wherein:

the second sub-circuit further comprises a first peripheral;

in a first operating mode of the plurality of operating modes, the input/output interface is configured to generate a binary data input signal as a function of the voltage at the first pad;

in a second operating mode of the plurality of operating modes, the input/output interface is configured to apply a voltage to the first pad as a function of a logic level of a binary data output signal; and in a third operating mode of the plurality of operating modes, the input/output interface is configured to provide the binary data input signal to the first peripheral or apply a voltage to the first pad based on the first peripheral.

22. The integrated circuit of claim 21, wherein the second sub-circuit further comprises a second peripheral, and wherein the selection circuit comprises:

a first multiplexer having a first input coupled to an output of a first latch of the plurality of latches, an output coupled to the input/output interface, and a selection input coupled to an output of a second latch of the plurality of latches;

a second multiplexer having a first input coupled to the first peripheral, a second input coupled to the second peripheral, and an output coupled to a second input of the first multiplexer;

a switch having a first input coupled to an output of a third latch of the plurality of latches and an output coupled to a selection input of the second multiplexer, the switch having a control input coupled to the output of the second latch;

a third multiplexer having a first input coupled to an output of a fourth latch of the plurality of latches, an output coupled to the input/output interface, and a selection input coupled to the output of the second latch of the plurality of latches;

a fourth multiplexer having a first input coupled to the first peripheral, a second input coupled to the second peripheral, an output coupled to a second input of the third multiplexer, and a selection input coupled to the output of the switch;

a first demultiplexer having a first output coupled to the first peripheral, a second output coupled to the second peripheral, and a selection input coupled to the output of the switch; and a second demultiplexer having an input coupled to the input/output interface, a first output coupled to the storage circuit, a second output coupled to a first input of the first demultiplexer, and a selection input coupled to the output of a second latch.

23. The integrated circuit of claim 22, wherein the input/output interface comprises:

an output driver configured to be enabled by the output of the third multiplexer, the output driver configured, when enabled, to apply a voltage to the first pad as a function of the output of the first multiplexer; and an input buffer configured to apply a binary data input signal to the input of the second demultiplexer as a function of the voltage at the first pad.

* * * * *